US007211452B2

(12) United States Patent
Cok et al.

(10) Patent No.: US 7,211,452 B2
(45) Date of Patent: May 1, 2007

(54) METHOD AND APPARATUS FOR UNIFORMITY AND BRIGHTNESS CORRECTION IN AN OLED DISPLAY

(75) Inventors: Ronald S. Cok, Rochester, NY (US); James H. Ford, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 287 days.

(21) Appl. No.: 10/946,845

(22) Filed: Sep. 22, 2004

(65) Prior Publication Data

US 2006/0063281 A1 Mar. 23, 2006

(51) Int. Cl.
*H01L 21/66* (2006.01)

(52) U.S. Cl. ...................... 438/16; 315/169.3; 345/55; 345/77

(58) Field of Classification Search ................. 438/16; 315/169.3; 345/55, 77; 257/E51.022
See application file for complete search history.

(56) References Cited

U.S. PATENT DOCUMENTS 6,414,661 B1 7/2002 Shen et al.
6,473,065 B1 10/2002 Fan
2004/0150590 A1* 8/2004 Cok et al. ..................... 345/76
2004/0164935 A1* 8/2004 Dedene et al. ............. 345/75.2
2005/0030267 A1* 2/2005 Tanghe et al. ................ 345/82
2005/0083269 A1* 4/2005 Lin et al. ...................... 345/76
2005/0110728 A1* 5/2005 Cok ............................ 345/82

OTHER PUBLICATIONS

U.S. Appl. No. 10/858,260; filed Jun. 1, 2004; titled "Uniformity And Brightness Measurement In OLED Displays"; of Ronald S. Cok et al.
U.S. Appl. No. 10/869,009; filed Jun. 16, 2004; titled "Method And Apparatus For Uniformity And Brightness Correction In An OLED Display"; of Ronald S. Cok et al.
U.S. Appl. No. 10/894,729; filed Jul. 20, 2004; titled "Method And Apparatus For Uniformity And Brightness Correction In An OLED"; of Ronald S. Cok et al.

* cited by examiner

*Primary Examiner*—Thao X. Le
*Assistant Examiner*—Abul Kalam
(74) *Attorney, Agent, or Firm*—Andrew J. Anderson

(57) ABSTRACT

A method for manufacturing and grading OLED devices is described, comprising the steps of: a) manufacturing OLED devices having a plurality of pixels; b) measuring pixel brightness and uniformity variation of each of the OLED devices prior to burning-in the OLED devices; c) correcting the pixel brightness and uniformity variation of each of the OLED devices prior to burning-in the OLED devices; d) grading each of the corrected OLED devices prior to burning-in the OLED devices; e) burning-in OLED devices graded as acceptable prior to burning-in the OLED devices; f) measuring burned-in pixel brightness and uniformity variation of each of the burned-in OLED devices; g) re-correcting the pixel brightness and uniformity variation of each of the burned-in OLED devices; and h) grading each of the re-corrected, burned-in OLED devices. The present invention has the advantage of providing improved yields in manufacture of OLED displays having acceptable uniformity and thereby reducing the cost of manufacturing an OLED display.

13 Claims, 4 Drawing Sheets

METHOD AND APPARATUS FOR UNIFORMITY AND BRIGHTNESS CORRECTION IN AN OLED DISPLAY

FIELD OF THE INVENTION

The present invention relates to the manufacture of OLED displays and, in particular, a method for the calibration, grading, and correction of OLED displays.

BACKGROUND OF THE INVENTION

Organic Light Emitting Diodes (OLEDs) have been known for some years and have been recently used in commercial display devices. Such devices employ both active-matrix and passive-matrix control schemes and may employ a plurality of pixels. The pixels are typically arranged in two-dimensional arrays with a row and a column address for each pixel and having a data value associated with the pixel value. However, such displays suffer from a variety of defects that limit the quality of the displays. In particular, OLED displays suffer from non-uniformities in the pixels. These non-uniformities can be attributed to both the light emitting materials in the display and, for active-matrix displays, to variability in the thin-film transistors used to drive the light emitting elements.

Referring to FIG. 2, in a current manufacturing and grading process, the OLED devices are first manufactured. This manufacturing step 100 involves, e.g., the preparation of a substrate, typically glass, the formation of electrodes and other electronic components on the substrate, the deposition of organic material layers, the addition of a second electrode, the encapsulation of the device, followed by singulation, packaging, and the attachment of electrical connectors. After the OLED device is manufactured, its performance is measured 110 to ensure that the light-emitting elements of the OLED device are working properly. Some faults may be present, for example stuck-on or stuck-off pixels, dark or bright pixels, and other non-uniform pixels. The OLED device may or may not meet the standards of the application for which it is intended so it is graded 120. If the OLED device does not meet the specification standards of the application, a repair 130 may be attempted. If the repair is not possible, the display is discarded 140. If it can be repaired, the repair is performed and the device tested 110 again.

If the OLED device does meet the application standards, it is a good device, and is subsequently burned-in 150 by illuminating the OLED device over a period of time with a burn-in pattern, for example a flat-field image. This burn-in process is necessary to ensure a stable operation of the device when it is first used in an application. Following burn-in, the device performance is again measured 160 and re-graded 170. If the device does not meet the specification at this point, it is discarded 180. If it does meet the specification, it may be shipped to a customer 190.

This process is effective but suffers from a high rejection rate. Some faults in light emitters may be compensated using a variety of means taught in the art. For example, copending, commonly assigned U.S. Ser. Nos. 10/858,260, 10/869,009 and 10/894,729 describe various means to detect and correct for some faults found in OLED devices. Other methods, for example, U.S. Pat. No. 6,414,661 B1 entitled "Method and apparatus for calibrating display devices and automatically compensating for loss in their efficiency over time" by Shen et al issued 20020702 describes a method and associated system that compensates for long-term variations in the light-emitting efficiency of individual organic light emitting diodes in an OLED display device by calculating and predicting the decay in light output efficiency of each pixel based on the accumulated drive current applied to the pixel and derives a correction coefficient that is applied to the next drive current for each pixel. The compensation system is best used after the display device has been calibrated to provide uniform light output. This patent provides a means for correcting the non-uniformities through the use of a look-up table.

U.S. Pat. No. 6,473,065 B1 entitled "Methods of improving display uniformity of organic light emitting displays by calibrating individual pixel" by Fan issued 20021029 describes methods of improving the display uniformity of an OLED. In order to improve the display uniformity of an OLED, the display characteristics of all organic-light-emitting-elements are measured, and calibration parameters for each organic-light-emitting-element are obtained from the measured display characteristics of the corresponding organic-light-emitting-element. The calibration parameters of each organic-light-emitting-element are stored in a calibration memory. The technique uses a combination of look-up tables and calculation circuitry to implement uniformity correction.

All of these correction schemes require uniformity and/or performance calibration information to be effective. However, the art does not teach manufacturing processes that provide a means to obtain the uniformity and/or performance calibration information in order to optimize the manufacturing process and thereby reducing the cost and improving the yield of the manufactured product.

There is a need, therefore, for an improved method of providing uniformity and reducing manufacturing costs in an OLED display manufacturing process.

SUMMARY OF THE INVENTION

In accordance with one embodiment, the invention is directed towards a method for manufacturing and grading OLED devices, comprising the steps of:

a) manufacturing OLED devices having a plurality of pixels;

b) measuring pixel brightness and uniformity variation of each of the OLED devices prior to burning-in the OLED devices;

c) correcting the pixel brightness and uniformity variation of each of the OLED devices prior to burning-in the OLED devices;

d) grading each of the corrected OLED devices prior to burning-in the OLED devices;

e) burning-in OLED devices graded as acceptable prior to burning-in the OLED devices;

f) measuring burned-in pixel brightness and uniformity variation of each of the burned-in OLED devices;

g) re-correcting the pixel brightness and uniformity variation of each of the burned-in OLED devices; and h) grading each of the re-corrected, burned-in OLED devices.

Advantages

The present invention has the advantage of providing improved yields in manufacture of OLED displays having acceptable uniformity and thereby reducing the cost of manufacturing an OLED display.

DETAILED DESCRIPTION OF THE INVENTION

Figure 1:
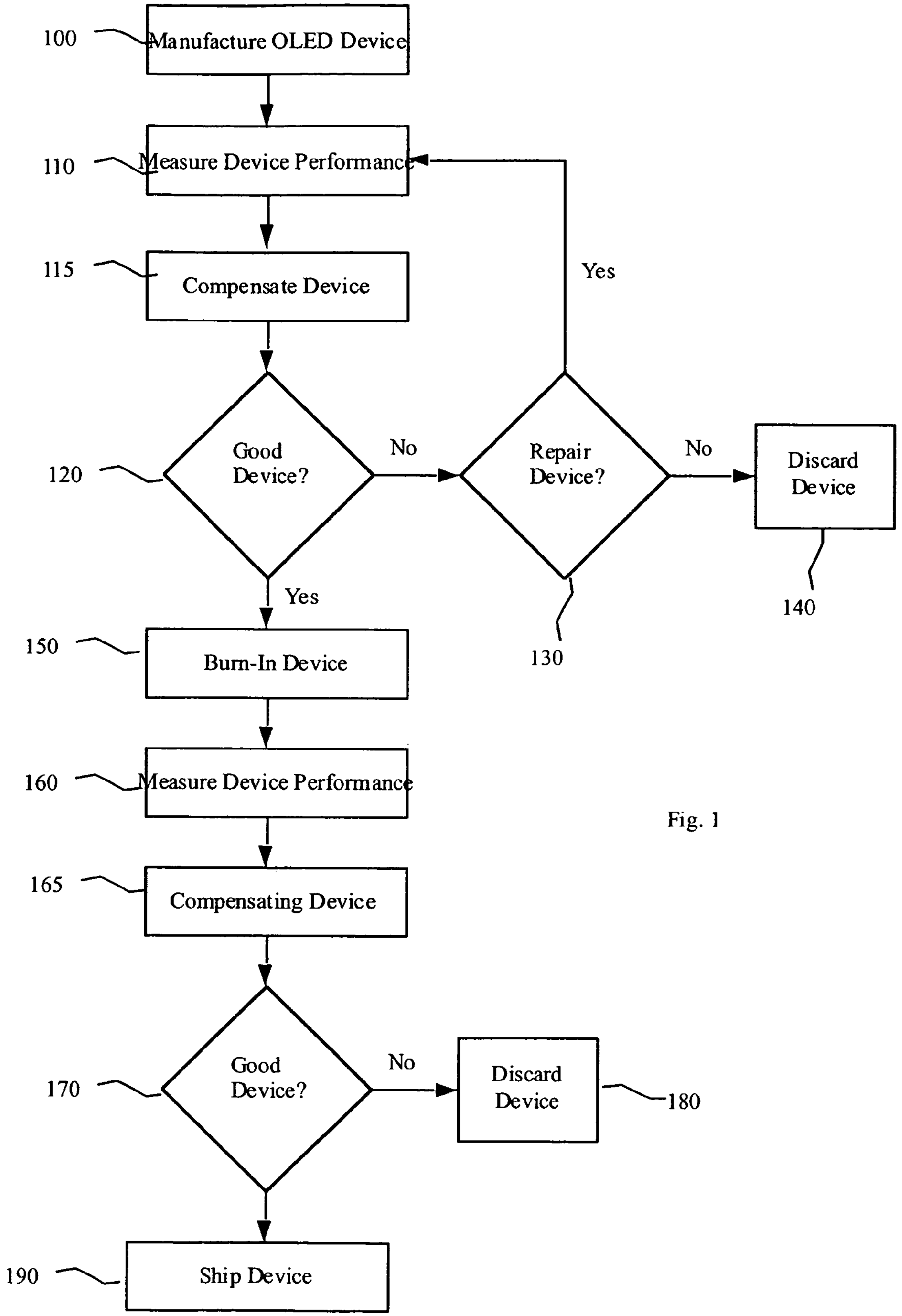
FIG. 1 is a flow diagram illustrating the method of the present invention.
Figure 2:
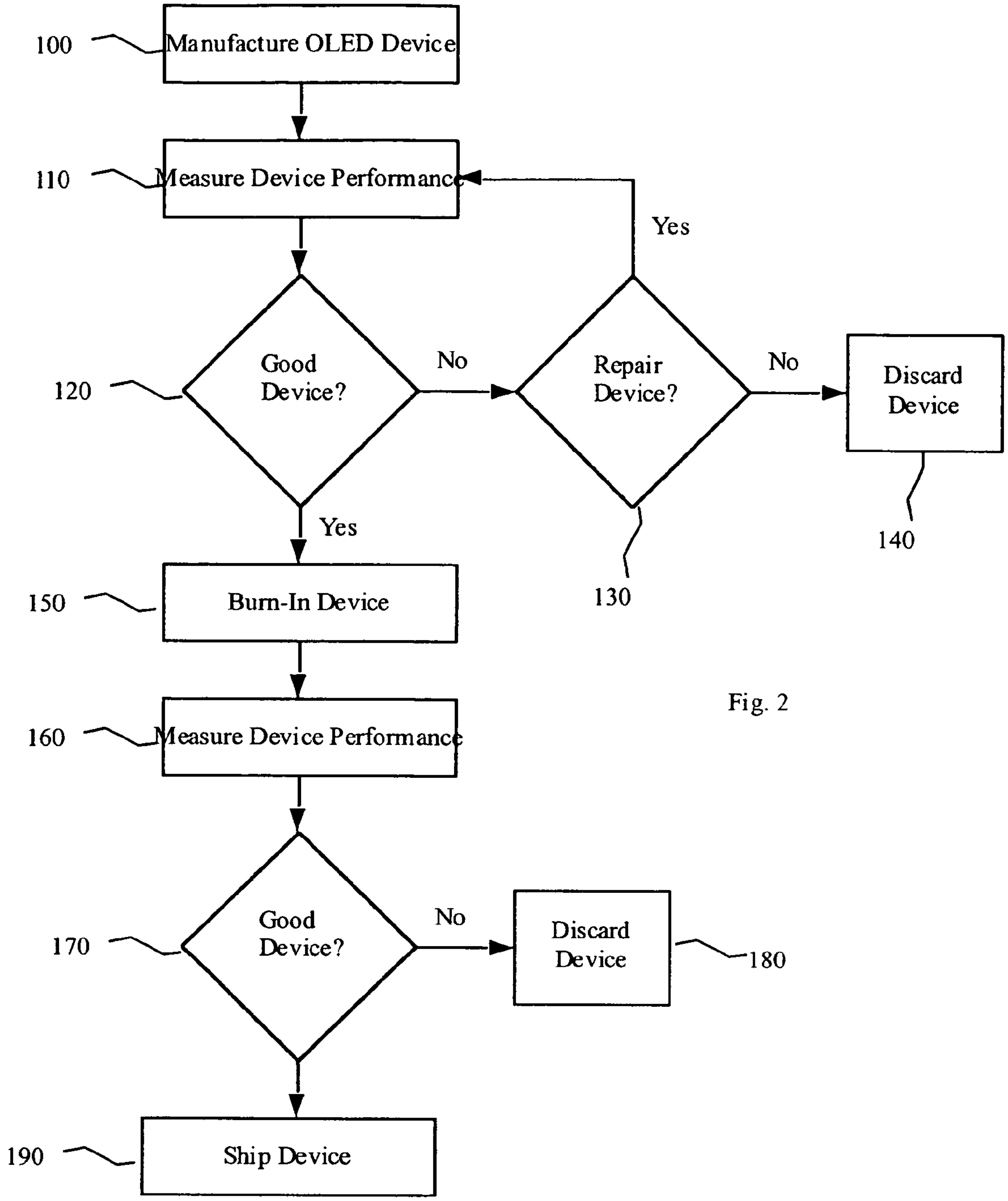
FIG. 2 is a flow diagram illustrating a currently practiced OLED device manufacturing method.

Referring to FIG. 1, a method for manufacturing an OLED device and providing improved correction of brightness and uniformity variations, comprises the steps of manufacturing 100 an OLED device having a plurality of pixels; measuring 110 the performance of the OLED device, including pixel brightness and uniformity variations prior to burning-in the OLED device; correcting the pixel brightness and uniformity variations of the OLED device prior to burning-in the OLED device by compensating 115 for the brightness and uniformity variations; grading 120 the corrected OLED devices prior to burning-in the OLED device; burning in 150 the OLED device which has been graded as acceptable prior to burning-in the OLED device; measuring 160 the burned-in pixel brightness and uniformity variation of the burned-in OLED device; re-correcting the pixel brightness and uniformity variations of the OLED device by compensating 165 for the brightness and uniformity variations; and grading 170 the re-corrected, burned-in OLED device for a second time. If the OLED device meets the required standards, it is shipped 190 to a customer. If it does not meet the required standards, it is discarded 180.

In a further embodiment of the present invention, after the first grading step 120, OLED devices that do not meet a specification, but that are graded as repairable, may be sent out for repair 130, for example by using laser repair techniques known in the art. Such techniques can repair some, but not all OLED device problems. If the device cannot be repaired, it is discarded 140. If it is repaired, the device performance may be measured 110 again and continue through the manufacturing process as described above. Alternatively, the repaired device may be burned in 150 without being re-measured in step 110.

The information gained by measuring the performance of the OLED device initially and after burn-in is used to form correction parameters employed to compensate the OLED device for non-uniformities. The information is typically stored in a controlling device, such as an integrated circuit controller or computer. The controlling device then employs the information to create signals that compensate the OLED device for non-uniformities. The information can include, but is not limited to, the light output from each light-emitting element of each pixel of the OLED device, brightness information for the OLED display as a whole, an identifier for the OLED device, the size, type, resolution, color, pixel patterns, materials, control signal, and display type information. As is known in the art, OLED devices also tend to age and decrease their light output over time as the OLEDs are used. In a further embodiment, the information from the initial measurement step 110 and the burned-in measurement step 160 are combined to form a record of the aging characteristics of the OLED device. This aging characteristic information may also be stored in and used by a controller to provide aging compensation to the OLED device in an application.

Burn-in may be the same for every pixel in an OLED device. That is, every pixel may receive the same instructions to illuminate the same amount. Alternatively, the burn-in process may be selective. Specific pixels may be burned-in at different rates than others, thereby providing uniformity in output without requiring external compensation. For example, brighter pixels may be burned-in at a higher current than dimmer pixels, so that after a period of time the brighter pixels will have aged more and will have the same brightness after aging as the other pixels.

OLED devices may have light emitting elements of different colors. The color elements may have their own performance characteristics, for example brightness, uniformity variation, and aging characteristics. The process described herein may be applied to each color plane of an OLED device separately. That is, the performance characteristics of, for example, the performance characteristics of red light emitters may be measured and compensated before grading, followed by the performance characteristics of green light emitters, followed by the performance characteristics of blue light emitters in an OLED device.

The present invention reduces the costs of the manufacturing process by improving yields. OLED devices may include non-uniformities that do not meet required standards. As is described in the prior art, by correcting the non-uniformities, devices that would otherwise be unusable, are made usable. However, simply performing the measurement and correction after a device has been burned-in does not optimize the manufacturing process flow. Some faults, such as stuck-on or stuck-off faults may not be correctable through a specific uniformity correction scheme. Some of these non-correctable faults, but not all, may be corrected by repair step 130. Those OLED devices that can neither be corrected through uniformity correction or repaired are discarded 140. Hence, using the process of the present invention, those OLED devices that cannot be repaired or corrected for non-uniformities do not pass any further through the manufacturing process. Since the initial repair and burn-in processes may be the most time-consuming and expensive processes, removing the non-correctable OLED devices from the process before the initial repair and burn-in processes reduces the cost of manufacturing the products. Not only will costs be reduced by improving the manufacturing process, they are reduced by performing the compensation described, since OLED devices that would not otherwise meet a specification will meet the specification after correcting the brightness and uniformity variations of the OLED device.

The method of manufacturing an OLED device, as described in step 100, is known in the art and may include the steps of providing a substrate, forming electronic circuitry including signal and power connections on the substrate, forming an electrode on the substrate, depositing layers of organic materials over the first electrode, forming a second electrode over the layers of organic materials, encapsulating the OLED device, singulating the OLED device, and attaching electrical connections to the signal and power conductors on the OLED device.

Referring to FIGS. 3–6, the method of the present invention may be implemented by a system for manufacturing an OLED device and providing improved correction of brightness and uniformity variations, comprising equipment 210 for manufacturing an OLED device; a measurement tool 220 for measuring the initial performance of the OLED device 200, including brightness and uniformity variations; a circuit 230 for correcting the brightness and uniformity variations of the OLED device; means 240 for grading the OLED device; a controller 250 for burning in the OLED device; a measurement tool 220 for measuring the burned-in performance of the OLED device, including brightness and uniformity variations; a circuit 230 for correcting the brightness and uniformity variations of the OLED device; and means for grading 240 the OLED device after burn-in and correction.

Figure 3:
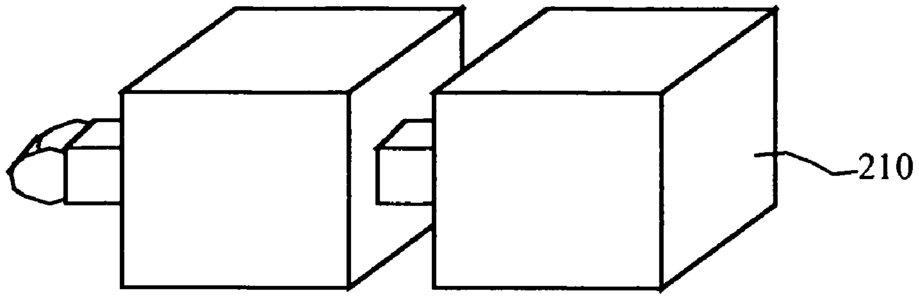
FIG. 3 is a perspective view of OLED device manufacturing equipment.
Figure 4:
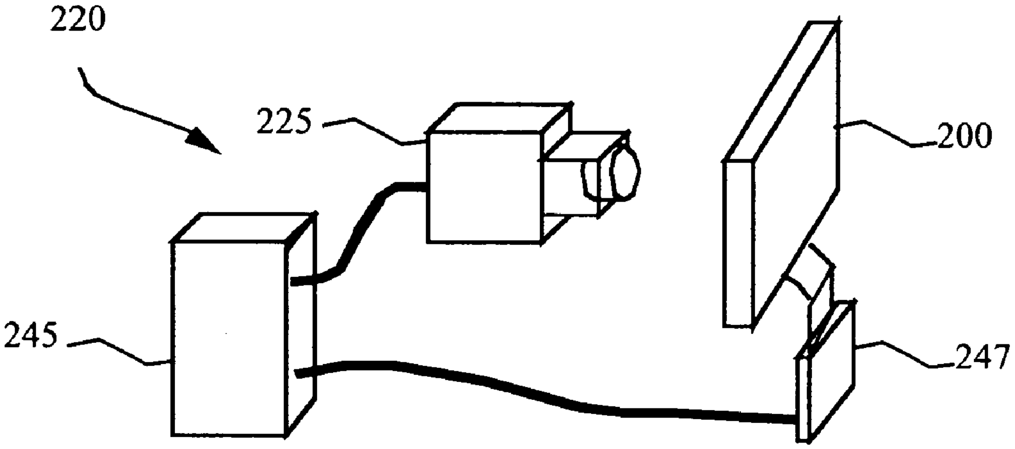
FIG. 4 is a perspective view of an OLED device performance measurement tool.

Referring to FIG. 3, manufacturing equipment 210 for manufacturing an OLED device is available from a variety of commercial vendors and may include, e.g., silicon deposition and photo-lithography equipment and organic layer deposition by means of evaporation or other coating technologies. A measurement tool 220 (FIG. 4) for measuring the performance characteristics of an OLED device 200 may include a digital camera 225 and controlling computer 245. The manufactured OLED device 200 may also be connected via a connector 247 to the controlling computer 245 to drive the OLED device 200 and digital camera 225 to measure the performance characteristics of the OLED device. Means to control an OLED device 200, a digital camera 225, programs for a computer 245 and suitable image and signal processing techniques are all known in the art and suitable designs are described in the references cited below.

Figure 5:
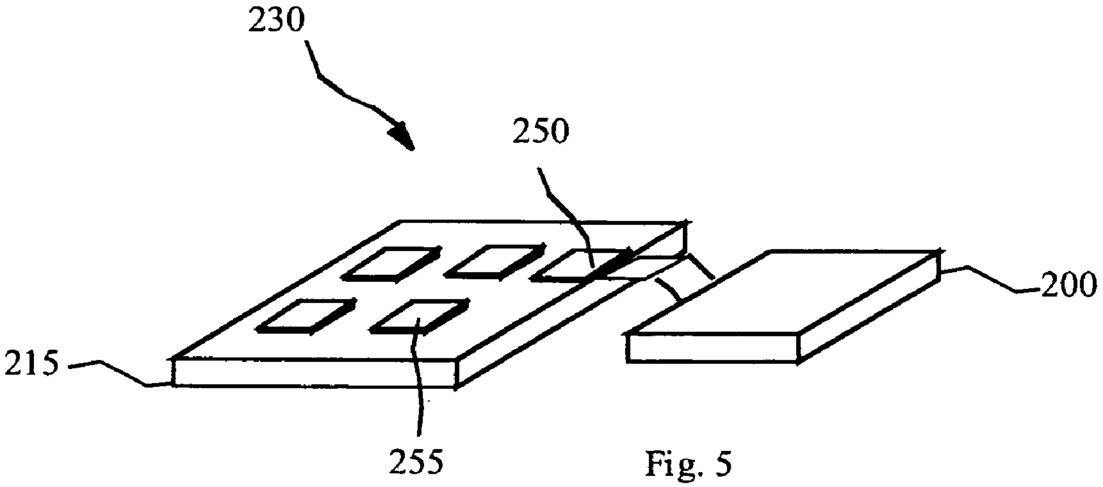
FIG. 5 is a perspective view of a circuit for correcting brightness and uniformity variations of OLED devices.

Referring to FIG. 5, the correction of uniformity and brightness variations in an OLED device 200 may be accomplished with commercially available integrated circuits 255, for example ASICs, memories, signal processors, and digital-to-analog convertors. Such circuits may be integrated onto a printed circuit board 215 together with a display controller 250. The controller and circuits may perform both the correction and burn-in tasks, since both tasks are accomplished by illuminating the OLED device 200 with signals.

Figure 6:
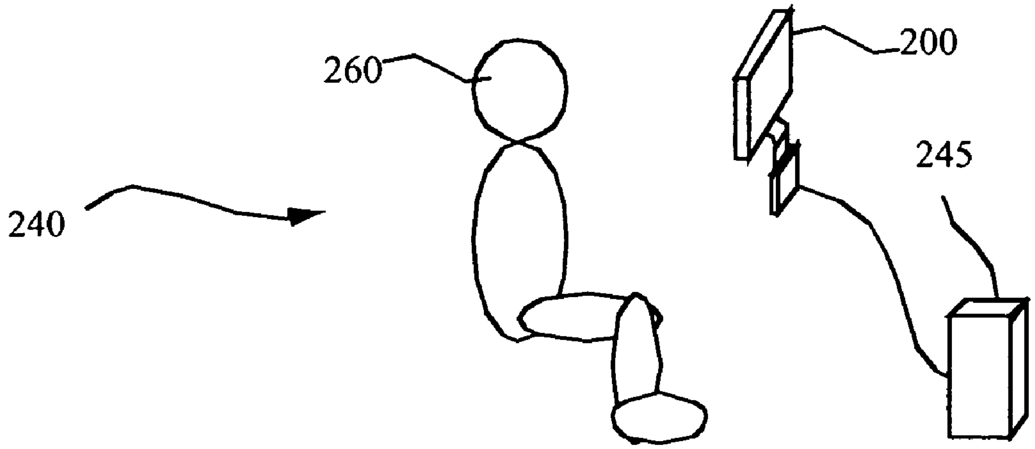
FIG. 6 is an illustration of a system for grading an OLED device.

Referring to FIG. 6, means 240 for grading an OLED device 200 may include an operator 260 manually reviewing an OLED display connected to a computer 245. As used here, grading refers to reviewing the performance of an OLED device and selecting or rejecting the OLED device on the basis of whether the performance of the OLED device meets one or more required specifications, or is repairable. The performance of the OLED device can be compared to a variety of specifications associated with a variety of applications for which different performance levels are specified and, as part of the grading process, the OLED device may be assigned to an application whose specifications are met by the OLED device. The grading means may alternatively be automated and include a digital image acquisition system (e.g., such as that shown in FIG. 4) with software for numerically calculating the OLED device performance and comparing the performance with required specifications. Such image and signal processing techniques are known in the art and include, for example, morphological processing, histogram techniques, thresholding, and filtering.

Figure 7:
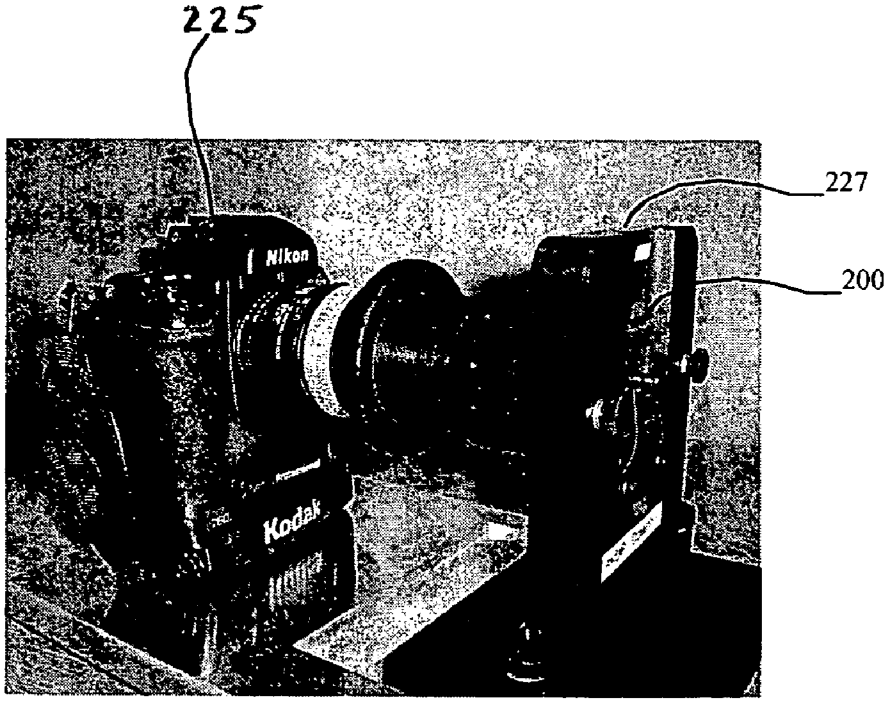
FIG. 7 is a photograph of a measurement and calibration system.

FIG. 7 is a photograph of a measurement and calibration system including a digital camera 225 and a fixture 227 for holding an OLED device 200.

Specific means for measuring the performance characteristics of an OLED device which may be employed in the present invention are known in the art (e.g., U.S. Pat. No. 6,414,661 B1 and U.S. Pat. No. 6,473,065 B1 referenced above), and also include those described, for example, in copending U.S. Ser. No. 10/858,260 referenced above. Means for correcting the uniformity of an OLED device which may be employed in the present invention are also known in the art (e.g., U.S. Pat. No. 6,414,661 B1 and U.S. Pat. No. 6,473,065 B1 referenced above), and also include those described, for example, in copending U.S. Ser. Nos. 10/869,009 and 10/894,729 referenced above. The disclosures of each of such patents and copending applications referenced in this paragraph are hereby incorporated by reference.

The invention has been described in detail with particular reference to certain preferred embodiments thereof, but it will be understood that variations and modifications can be effected within the spirit and scope of the invention.

PARTS LIST

100 manufacture step
110 measure step
115 compensate step
120 grading step
130 repair step
140 discard step
150 burn-in step
160 measure step
165 compensate step
170 grading step
180 discard step
190 ship step
200 OLED device
210 manufacturing equipment
215 printed circuit board
220 measurement tool
225 digital camera
227 fixture
230 circuit
240 grading means
245 computer
247 connector
250 controller
255 integrated circuits
260 operator

The invention claimed is:

1. A method for manufacturing and grading OLED devices, comprising the steps of:

a) manufacturing OLED devices having a plurality of pixels;

b) measuring pixel brightness and uniformity variation of each of the OLED devices prior to burning-in the OLED devices;

c) correcting the pixel brightness and uniformity variation of each of the OLED devices prior to burning-in the OLED devices;

d) grading each of the corrected OLED devices prior to burning-in the OLED devices;

e) burning-in OLED devices-which are graded as acceptable in step (d);

f) measuring burned-in pixel brightness and uniformity variation of each of the burned-in OLED devices;

g) re-correcting the pixel brightness and uniformity variation of each of the burned-in OLED devices; and h) grading each of the re-corrected, burned-in OLED devices.

2. The method of claim 1 further comprising repairing an OLED device initially graded as repairable to obtain an OLED device graded as acceptable prior to burning-in the OLED devices.

3. The method of claim 2 wherein the repairing is performed using a laser repair.

4. The method of claim 1 further comprising a step of storing the pixel brightness and uniformity variation information measured in step b).

5. The method of claim 1 further comprising a step of storing the burned-in pixel brightness and uniformity variation information measured in step f).

6. The method of claim 1 further comprising a step of comparing the pixel brightness and uniformity variation information obtained prior to burning-in an OLED device and the burned-in pixel brightness and uniformity variation information of the same OLED device to obtain a measure of the aging characteristics of the OLED device.

7. The method of claim 6 further comprising a step of storing the measure of the aging characteristics of the OLED device.

8. The method of claim 1 wherein the OLED devices are color devices comprising differently colored pixels and the pixel brightness and uniformity variation information is measured separately for each different color.

9. The method of claim 1 wherein the step of correcting the pixel brightness and uniformity variation of each of the OLED devices in step (c) improves manufacturing yield of OLED devices graded as acceptable in step (h).

10. The method of claim 1 wherein step (a) includes the steps of: providing a substrate; forming electronic circuitry including signal and power connections on the substrate; forming an electrode on the substrate; depositing layers of organic materials, including at least one light-emitting layer, over the first electrode; forming a second electrode over the layers of organic materials; encapsulating the OLED device; singulating the OLED device; and attaching electrical connections to the signal and power connections of the OLED device.

11. The method of claim 1 wherein the step of burning in OLED devices includes a step of uniformly illuminating every pixel of an OLED device.

12. The method of claim 1 wherein the step of burning in OLED devices includes a step of selectively illuminating some pixels differently than other pixels of an OLED device.

13. The method of claim 12 wherein relatively brighter pixels of an OLED device are illuminated more brightly than darker pixels of the device to age the brighter pixels more than the darker pixels.

* * * * *